United States Patent
Williams

(10) Patent No.: US 7,656,236 B2
(45) Date of Patent: Feb. 2, 2010

(54) NOISE CANCELING TECHNIQUE FOR FREQUENCY SYNTHESIZER

(75) Inventor: Anthony David Williams, Aptos, CA (US)

(73) Assignee: Teledyne Wireless, LLC, Mountain View, CA (US)

( * ) Notice: Subject to any disclaimer, the term of this patent is extended or adjusted under 35 U.S.C. 154(b) by 219 days.

(21) Appl. No.: 11/803,602

(22) Filed: May 15, 2007

(65) Prior Publication Data

US 2008/0284525 A1 Nov. 20, 2008

(51) Int. Cl.
*H03L 7/00* (2006.01)

(52) U.S. Cl. .......................... 331/16; 331/1 R; 331/11; 375/376

(58) Field of Classification Search ................... 331/16, 331/1 R, 11; 375/376
See application file for complete search history.

(56) References Cited

U.S. PATENT DOCUMENTS

| 2,111,412 A | 3/1938 | Ungelenk |
| 2,493,606 A | 1/1950 | Waterton |
| 2,706,366 A | 4/1955 | Best |
| 2,718,622 A | 9/1955 | Harkless |
| 2,939,952 A | 6/1960 | Paul et al. |
| 2,950,389 A | 8/1960 | Paul et al. |
| 3,065,640 A | 11/1962 | Langmuir et al. |
| 3,119,969 A | 1/1964 | Ducot et al. |
| 3,260,875 A | 7/1966 | Evans |
| 3,300,677 A | 1/1967 | Karol et al. |
| 3,310,864 A | 3/1967 | MacKerrow |
| 3,334,225 A | 8/1967 | Langmuir |
| 3,423,638 A | 1/1969 | Dix et al. |
| 3,453,711 A | 7/1969 | Miller |
| 3,541,467 A | 11/1970 | Seidel |
| 3,546,511 A | 12/1970 | Shimula |
| 3,564,124 A | 2/1971 | Popovich |
| 3,612,880 A | 10/1971 | Lansiart |
| 3,617,740 A | 11/1971 | Skillicorn |
| 3,624,678 A | 11/1971 | Falce |

(Continued)

FOREIGN PATENT DOCUMENTS

CH 260999 8/1949

(Continued)

OTHER PUBLICATIONS

Rohde, U., "Microwave and Wireless Synthesizers Theory and Design," *Digital PLL Synthesizers*, pp. 422-427, John Wiley & Sons Inc., 1977, ISBN 0-471-52019-5.

(Continued)

*Primary Examiner*—Joseph Chang
*Assistant Examiner*—Jeffrey Shin
(74) *Attorney, Agent, or Firm*—K & L Gates LLP

(57) ABSTRACT

A frequency synthesizer is disclosed. According to one embodiment, the frequency synthesizer includes an input terminal and an output terminal, a loop filter, a digital phase detector, and an analog phase detector. The digital phase detector includes a first input coupled to the input terminal, a second input coupled to the output terminal, and an output coupled to the loop filter, the digital phase detector is configured to operate at a first phase comparison frequency. The analog phase detector includes a first input coupled to the input terminal, a second input coupled to the output terminal, and an output alternating current (AC) coupled to the loop filter, the analog phase detector is configured to operate at a second phase comparison frequency. The first phase comparison frequency is different from the second phase comparison frequency.

22 Claims, 7 Drawing Sheets

U.S. PATENT DOCUMENTS

| | | |
|---|---|---|
| 3,688,222 A | 8/1972 | Lieberman |
| 3,696,324 A | 10/1972 | Baum |
| 3,716,745 A | 2/1973 | Phillips |
| 3,748,729 A | 7/1973 | Bottcher et al. |
| 3,753,140 A | 8/1973 | Feistel |
| 3,755,717 A | 8/1973 | Shaw |
| 3,780,334 A | 12/1973 | Leboutet |
| 3,796,965 A | 3/1974 | Quesinberry et al. |
| 3,873,889 A | 3/1975 | Leyba |
| 3,886,470 A | 5/1975 | O'Neil et al. |
| 3,893,048 A | 7/1975 | Lieberman |
| 3,900,823 A | 8/1975 | Sokal et al. |
| 3,946,341 A | 3/1976 | Chiron et al. |
| 3,955,161 A | 5/1976 | MacTurk |
| 3,956,712 A | 5/1976 | Hant |
| 4,000,471 A | 12/1976 | Pankow |
| 4,004,253 A | 1/1977 | Takesaki et al. |
| 4,016,515 A | 4/1977 | Wauk, II |
| 4,034,319 A | 7/1977 | Olsson |
| 4,035,747 A | 7/1977 | Hindermayr et al. |
| 4,037,182 A | 7/1977 | Burnett et al. |
| 4,053,855 A | 10/1977 | Kivi et al. |
| 4,059,815 A | 11/1977 | Makimoto et al. |
| 4,061,944 A | 12/1977 | Gay |
| 4,100,450 A | 7/1978 | Frutiger et al. |
| 4,126,370 A | 11/1978 | Nijman |
| 4,134,114 A | 1/1979 | Riggs et al. |
| 4,165,472 A | 8/1979 | Wittry |
| 4,184,123 A | 1/1980 | Grill et al. |
| 4,197,540 A | 4/1980 | Riggs et al. |
| 4,216,448 A | 8/1980 | Kasuga et al. |
| 4,233,539 A | 11/1980 | Falce |
| 4,258,328 A | 3/1981 | Prevot et al. |
| 4,267,516 A | 5/1981 | Traa |
| 4,270,069 A | 5/1981 | Wiehler |
| 4,276,514 A | 6/1981 | Huang |
| 4,278,957 A | 7/1981 | Starai et al. |
| 4,292,610 A | 9/1981 | Makimoto et al. |
| 4,304,978 A | 12/1981 | Saunders |
| 4,309,677 A | 1/1982 | Goldman |
| 4,359,666 A | 11/1982 | Tomoe |
| 4,374,394 A | 2/1983 | Camisa |
| 4,376,927 A | 3/1983 | McGalliard |
| 4,379,741 A | 4/1983 | Sano et al. |
| 4,382,238 A | 5/1983 | Makimoto et al. |
| 4,406,770 A | 9/1983 | Chan et al. |
| 4,412,272 A | 10/1983 | Wedertz et al. |
| 4,431,977 A | 2/1984 | Sokola et al. |
| 4,446,445 A | 5/1984 | Apel |
| 4,455,504 A | 6/1984 | Iversen |
| 4,488,128 A | 12/1984 | Odozynski |
| 4,495,640 A | 1/1985 | Frey |
| 4,506,241 A | 3/1985 | Makimoto et al. |
| 4,510,551 A | 4/1985 | Brainard, II |
| 4,532,478 A | 7/1985 | Silagi |
| 4,540,884 A | 9/1985 | Stafford et al. |
| 4,540,954 A | 9/1985 | Apel |
| 4,554,514 A | 11/1985 | Whartenby et al. |
| 4,560,829 A | 12/1985 | Reed et al. |
| 4,577,340 A | 3/1986 | Carlson et al. |
| 4,581,595 A | 4/1986 | Silagi |
| 4,583,049 A | 4/1986 | Powell |
| 4,584,699 A | 4/1986 | LaFiandra et al. |
| 4,595,882 A | 6/1986 | Silagi et al. |
| 4,600,892 A | 7/1986 | Wagner et al. |
| 4,622,687 A | 11/1986 | Whitaker et al. |
| 4,625,533 A | 12/1986 | Okada et al. |
| 4,629,996 A | 12/1986 | Watanabe et al. |
| 4,631,506 A | 12/1986 | Makimoto et al. |
| 4,664,769 A | 5/1987 | Cuomo et al. |
| 4,688,239 A | 8/1987 | Schaffner et al. |
| 4,701,717 A | 10/1987 | Radermacher et al. |
| 4,727,641 A | 3/1988 | Kanatani et al. |
| 4,728,846 A | 3/1988 | Yasuda |
| 4,730,173 A | 3/1988 | Tsunoda |
| 4,733,208 A | 3/1988 | Ishikawa et al. |
| 4,736,101 A | 4/1988 | Syka et al. |
| 4,739,448 A | 4/1988 | Rowe et al. |
| 4,740,765 A | 4/1988 | Ishikawa et al. |
| 4,749,860 A | 6/1988 | Kelley et al. |
| 4,761,545 A | 8/1988 | Marshall et al. |
| 4,771,172 A | 9/1988 | Weber-Grabau et al. |
| 4,779,056 A | 10/1988 | Moore et al. |
| 4,788,705 A | 11/1988 | Anderson |
| 4,792,879 A | 12/1988 | Bauknecht et al. |
| 4,818,869 A | 4/1989 | Weber-Grabau |
| 4,828,022 A | 5/1989 | Koehler et al. |
| 4,841,179 A | 6/1989 | Hagino et al. |
| 4,882,484 A | 11/1989 | Franzen et al. |
| 4,885,551 A | 12/1989 | Myer |
| 4,888,564 A * | 12/1989 | Ishigaki ..................... 331/1 A |
| 4,890,077 A | 12/1989 | Sun |
| 4,891,615 A | 1/1990 | Komazaki et al. |
| 4,899,354 A | 2/1990 | Reinhold |
| 4,907,065 A | 3/1990 | Sahakian |
| 4,928,206 A | 5/1990 | Porter et al. |
| 4,928,296 A | 5/1990 | Kadambi |
| 4,959,705 A | 9/1990 | Lemnios et al. |
| 4,967,169 A | 10/1990 | Sun et al. |
| 4,967,260 A | 10/1990 | Butt |
| 4,974,057 A | 11/1990 | Tazima |
| 4,975,577 A | 12/1990 | Franzen et al. |
| 4,982,088 A | 1/1991 | Weitekamp et al. |
| 4,985,690 A | 1/1991 | Eguchi et al. |
| 4,988,392 A | 1/1991 | Nicholson et al. |
| 4,990,948 A | 2/1991 | Sasaki et al. |
| 5,021,743 A | 6/1991 | Chu et al. |
| 5,030,933 A | 7/1991 | Ikeda |
| 5,045,971 A | 9/1991 | Ono et al. |
| 5,055,966 A | 10/1991 | Smith et al. |
| 5,056,127 A | 10/1991 | Iversen et al. |
| 5,065,110 A | 11/1991 | Ludvik et al. |
| 5,065,123 A | 11/1991 | Heckaman et al. |
| 5,075,547 A | 12/1991 | Johnson et al. |
| 5,097,318 A | 3/1992 | Tanaka et al. |
| 5,126,633 A | 6/1992 | Avnery et al. |
| 5,128,542 A | 7/1992 | Yates et al. |
| 5,134,286 A | 7/1992 | Kelley |
| 5,144,268 A | 9/1992 | Weidman |
| 5,148,117 A | 9/1992 | Talwar |
| 5,166,649 A | 11/1992 | Aizawa et al. |
| 5,170,054 A | 12/1992 | Franzen |
| 5,173,672 A | 12/1992 | Heine |
| 5,173,931 A | 12/1992 | Pond |
| 5,182,451 A | 1/1993 | Schwartz et al. |
| 5,182,524 A | 1/1993 | Hopkins |
| 5,196,699 A | 3/1993 | Kelley |
| 5,198,665 A | 3/1993 | Wells |
| 5,200,613 A | 4/1993 | Kelley |
| 5,250,916 A | 10/1993 | Zakman |
| 5,274,233 A | 12/1993 | Kelley |
| 5,285,063 A | 2/1994 | Schwartz et al. |
| 5,291,062 A | 3/1994 | Higgins, III |
| 5,291,158 A | 3/1994 | Blair et al. |
| 5,295,175 A | 3/1994 | Pond |
| 5,300,791 A | 4/1994 | Chen et al. |
| 5,302,826 A | 4/1994 | Wells |
| 5,311,059 A | 5/1994 | Banerji et al. |
| 5,311,402 A | 5/1994 | Kobayashi et al. |
| 5,319,211 A | 6/1994 | Matthews et al. |
| 5,329,687 A | 7/1994 | Scott et al. |
| 5,334,295 A | 8/1994 | Gallagher et al. |
| 5,336,390 A | 8/1994 | Busack et al. |
| 5,355,283 A | 10/1994 | Marrs et al. |

| Patent No. | Date | Inventor |
|---|---|---|
| 5,372,696 A | 12/1994 | Kiesele et al. |
| 5,378,898 A | 1/1995 | Schonberg et al. |
| 5,389,903 A | 2/1995 | Piirainen |
| 5,395,507 A | 3/1995 | Aston et al. |
| 5,404,273 A | 4/1995 | Akagawa |
| 5,438,686 A | 8/1995 | Gehri et al. |
| 5,457,269 A | 10/1995 | Schonberg et al. |
| 5,468,159 A | 11/1995 | Brodsky et al. |
| 5,477,081 A | 12/1995 | Nagayoshi |
| 5,483,074 A | 1/1996 | True |
| 5,493,074 A | 2/1996 | Murata et al. |
| 5,495,215 A | 2/1996 | Newell et al. |
| 5,498,487 A | 3/1996 | Ruka et al. |
| 5,500,621 A | 3/1996 | Katz et al. |
| 5,523,577 A | 6/1996 | Schonberg et al. |
| 5,528,203 A | 6/1996 | Mohwinkel et al. |
| 5,529,959 A | 6/1996 | Yamanaka |
| 5,541,975 A | 7/1996 | Anderson et al. |
| 5,557,163 A | 9/1996 | Wakalopulos |
| 5,561,085 A | 10/1996 | Gorowitz et al. |
| 5,576,660 A | 11/1996 | Pouysegur et al. |
| 5,576,673 A | 11/1996 | Asija |
| 5,578,869 A | 11/1996 | Hoffman et al. |
| 5,598,034 A | 1/1997 | Wakefield |
| 5,608,331 A | 3/1997 | Newberg et al. |
| 5,612,257 A | 3/1997 | Tserng et al. |
| 5,612,588 A | 3/1997 | Wakalopulos |
| 5,614,442 A | 3/1997 | Tsemg |
| 5,621,270 A | 4/1997 | Allen |
| 5,623,123 A | 4/1997 | Umehars |
| 5,627,871 A | 5/1997 | Wang |
| 5,635,762 A | 6/1997 | Gamand |
| 5,644,169 A | 7/1997 | Chun |
| 5,668,512 A | 9/1997 | Mohwinkel et al. |
| 5,675,288 A | 10/1997 | Peyrotte et al. |
| 5,682,412 A | 10/1997 | Skillicorn et al. |
| 5,696,473 A | 12/1997 | Tsujiguchi et al. |
| 5,705,959 A | 1/1998 | O'Loughlin |
| 5,708,283 A | 1/1998 | Wen et al. |
| 5,719,539 A | 2/1998 | Ishizaki et al. |
| 5,723,904 A | 3/1998 | Shiga |
| 5,728,289 A | 3/1998 | Kirchnavy et al. |
| 5,736,783 A | 4/1998 | Wein et al. |
| 5,737,387 A | 4/1998 | Smither |
| 5,742,002 A | 4/1998 | Arredondo et al. |
| 5,742,201 A | 4/1998 | Eisenberg et al. |
| 5,742,204 A | 4/1998 | Bell |
| 5,742,214 A | 4/1998 | Toda et al. |
| 5,748,058 A | 5/1998 | Scott |
| 5,749,638 A | 5/1998 | Cornelissen et al. |
| 5,753,857 A | 5/1998 | Choi |
| 5,760,646 A | 6/1998 | Belcher et al. |
| 5,760,650 A | 6/1998 | Faulkner et al. |
| 5,761,317 A | 6/1998 | Pritchard |
| 5,783,900 A | 7/1998 | Humphries, Jr. et al. |
| 5,789,852 A | 8/1998 | Cornelissen et al. |
| 5,796,211 A | 8/1998 | Graebner et al. |
| 5,818,692 A | 10/1998 | Denney, Jr. et al. |
| 5,825,195 A | 10/1998 | Hembree et al. |
| 5,830,337 A | 11/1998 | Xu |
| 5,832,598 A | 11/1998 | Greenman et al. |
| 5,835,355 A | 11/1998 | Dordi |
| 5,838,195 A | 11/1998 | Szmurto et al. |
| 5,847,453 A | 12/1998 | Uematsu et al. |
| 5,861,777 A | 1/1999 | Sigmon et al. |
| 5,877,560 A | 3/1999 | Wen et al. |
| 5,886,248 A | 3/1999 | Paulus et al. |
| 5,903,239 A | 5/1999 | Takahashi et al. |
| 5,909,032 A | 6/1999 | Wakalopulos |
| 5,910,753 A | 6/1999 | Bogdan |
| 5,915,213 A | 6/1999 | Iwatsuki et al. |
| 5,930,688 A | 7/1999 | Floyd et al. |
| 5,932,926 A | 8/1999 | Maruyama et al. |
| 5,940,025 A | 8/1999 | Koehnke et al. |
| 5,942,092 A | 8/1999 | Weyl et al. |
| 5,945,734 A | 8/1999 | McKay |
| 5,949,140 A | 9/1999 | Nishi et al. |
| 5,962,995 A | 10/1999 | Avnery |
| 5,982,233 A | 11/1999 | Hellmark et al. |
| 5,986,506 A | 11/1999 | Oga |
| 5,990,735 A | 11/1999 | Sigmon et al. |
| 5,990,757 A | 11/1999 | Tonomura et al. |
| 5,990,763 A | 11/1999 | Sipilä |
| 5,998,817 A | 12/1999 | Wen et al. |
| 5,998,862 A | 12/1999 | Yamanaka |
| 5,998,877 A | 12/1999 | Ohuchi |
| 6,008,534 A | 12/1999 | Fulcher |
| 6,020,629 A | 2/2000 | Farnworth et al. |
| 6,024,618 A | 2/2000 | Makishima et al. |
| 6,028,460 A * | 2/2000 | McCollum et al. .......... 327/105 |
| 6,069,027 A | 5/2000 | Mertol et al. |
| 6,087,716 A | 7/2000 | Ikeda |
| 6,099,708 A | 8/2000 | Mallory et al. |
| 6,124,636 A | 9/2000 | Kusamitsu |
| 6,137,168 A | 10/2000 | Kirkman |
| 6,140,710 A | 10/2000 | Greenberg |
| 6,157,080 A | 12/2000 | Tamaki et al. |
| 6,157,085 A | 12/2000 | Terashima |
| 6,169,323 B1 | 1/2001 | Sakamoto |
| 6,177,836 B1 | 1/2001 | Young et al. |
| 6,225,696 B1 | 5/2001 | Hathaway et al. |
| 6,255,767 B1 | 7/2001 | Lee et al. |
| 6,274,927 B1 | 8/2001 | Glenn |
| 6,285,254 B1 | 9/2001 | Chen et al. |
| 6,305,214 B1 | 10/2001 | Schattke et al. |
| 6,320,543 B1 | 11/2001 | Ohata et al. |
| 6,353,257 B1 | 3/2002 | Huang |
| 6,358,773 B1 | 3/2002 | Lin et al. |
| 6,359,476 B2 | 3/2002 | Hartman et al. |
| 6,400,415 B1 | 6/2002 | Danielsons |
| 6,404,291 B1 * | 6/2002 | Riley ........................... 331/11 |
| 6,407,492 B1 | 6/2002 | Avnery et al. |
| 6,414,849 B1 | 7/2002 | Chiu |
| 6,441,692 B1 | 8/2002 | Nakatani et al. |
| 6,443,632 B2 | 9/2002 | Ando et al. |
| 6,459,337 B1 | 10/2002 | Goren et al. |
| 6,462,413 B1 | 10/2002 | Polese et al. |
| 6,507,110 B1 | 1/2003 | Chen et al. |
| 6,515,525 B2 | 2/2003 | Hasegawa |
| 6,545,398 B1 | 4/2003 | Avnery |
| 6,549,765 B2 | 4/2003 | Welland et al. |
| 6,553,089 B2 | 4/2003 | Huh et al. |
| 6,566,748 B1 | 5/2003 | Shimizu et al. |
| 6,570,452 B2 | 5/2003 | Sridharan |
| 6,590,450 B2 | 7/2003 | Chen et al. |
| 6,593,783 B2 | 7/2003 | Ichimaru |
| 6,597,250 B2 | 7/2003 | Jovenin |
| 6,600,378 B1 | 7/2003 | Patana |
| 6,603,360 B2 | 8/2003 | Kim et al. |
| 6,608,529 B2 | 8/2003 | Franca-Neto |
| 6,622,010 B1 | 9/2003 | Ichimaru |
| 6,630,774 B2 | 10/2003 | Avnery |
| 6,674,229 B2 | 1/2004 | Avnery et al. |
| 6,714,113 B1 | 3/2004 | Abadeer et al. |
| 6,731,015 B2 | 5/2004 | Wu et al. |
| 6,750,461 B2 | 6/2004 | Fink et al. |
| 7,026,749 B2 | 4/2006 | Rho et al. |
| 7,038,507 B2 | 5/2006 | Williams |
| 7,061,330 B2 * | 6/2006 | Kegasa et al. .................. 331/11 |
| 7,084,709 B1 * | 8/2006 | Leong et al. .................. 331/11 |
| 2002/0030269 A1 | 3/2002 | Ammar |
| 2002/0093379 A1 | 7/2002 | Goren et al. |
| 2002/0136341 A1 * | 9/2002 | Huh et al. .................... 375/376 |
| 2003/0021377 A1 | 1/2003 | Turner et al. |
| 2003/0058961 A1 | 3/2003 | Fling et al. |
| 2003/0132529 A1 | 7/2003 | Yeo et al. |

| | | | |
|---|---|---|---|
| 2003/0151133 A1 | 8/2003 | Kinayman et al. | |
| 2004/0223575 A1* | 11/2004 | Meltzer et al. | 375/376 |
| 2005/0077969 A1* | 4/2005 | Lalt et al. | 331/1 A |
| 2005/0077973 A1 | 4/2005 | Dayton, Jr. | |
| 2005/0104667 A1* | 5/2005 | Williams | 331/12 |
| 2009/0096378 A1 | 4/2009 | Barnett et al. | |

FOREIGN PATENT DOCUMENTS

| | | |
|---|---|---|
| DE | 965048 | 5/1957 |
| DE | 26539856 | 2/1978 |
| DE | 3438382 A1 | 4/1986 |
| DE | 4111703 C2 | 11/1991 |
| EP | 60039747 | 1/1985 |
| EP | 0148706 | 7/1985 |
| EP | 0180328 | 5/1986 |
| EP | 0205399 A2 | 12/1986 |
| EP | 0293791 A1 | 7/1988 |
| EP | 0331289 | 9/1989 |
| EP | 0336990 | 10/1989 |
| EP | 0350159 A | 1/1990 |
| EP | 0 377 519 | 7/1990 |
| EP | 0383961 | 8/1990 |
| EP | 0 393 584 A2 | 10/1990 |
| EP | 0411180 | 2/1991 |
| EP | 491161 | 6/1992 |
| EP | 0524011 | 1/1993 |
| EP | 0617465 A1 | 9/1994 |
| EP | 0641035 A2 | 3/1995 |
| EP | 0786660 A2 | 7/1997 |
| GB | 760555 | 10/1956 |
| GB | 984607 | 2/1965 |
| GB | 1302605 | 1/1973 |
| GB | 1507458 | 4/1978 |
| GB | 1519456 | 7/1978 |
| GB | 2018171 | 10/1979 |
| GB | 2143237 A | 2/1985 |
| GB | 2178540 A | 2/1987 |
| GB | 2271471 | 4/1994 |
| GB | 2326485 A | 12/1998 |
| JP | 56-107601 | 8/1981 |
| JP | 58-019001 | 2/1983 |
| JP | 58-178602 | 10/1983 |
| JP | 173903 | 7/1989 |
| JP | 01173777 | 7/1989 |
| JP | 283074 | 11/1989 |
| JP | 02226801 | 9/1990 |
| JP | 403048448 | 3/1991 |
| JP | 03187247 | 8/1991 |
| JP | 61 51946 | 5/1994 |
| JP | 61 99629 | 7/1994 |
| JP | 204705 | 7/1994 |
| JP | 08237007 | 9/1996 |
| WO | WO 82/03522 | 10/1982 |
| WO | WO 83/02850 | 8/1983 |
| WO | WO 93/01625 | 1/1993 |
| WO | WO 93/24968 | 12/1993 |
| WO | WO 97/17738 | 5/1997 |
| WO | WO 97/17755 | 5/1997 |
| WO | WO 99/22229 | 5/1999 |
| WO | WO 00/07239 | 7/1999 |

OTHER PUBLICATIONS

400 MSPS, 14-Bit, 1.8 V CMO, Direct Digital Synthesizer, AD 9954, Analog Devices, www.analog.com.
Piloni, M., "A New Millimeter-wave Synthesizer for Point to Point Radio Supporting High Data Rates Using Complex Modulation Formats," 35$^{th}$ European Microwave Conference—Paris, 2005.
Gilbert Cell UHF Transistor Array, Intersil, HFA3101, Sep. 2004, FN3663.5.
1 GSPS Direct Digital Synthesizer, AD9858, Analog Devices, www.analog.com.
PLL Frequency Synthesizer ADF4106, Analog Devices, www.analog.com.
"400 MSPS 14-Bit, 1.8 V CMOS, Direct Digital Synthesizer", AD995, Analog Devices, 2003, 34 pages.
"RF PLL Frequency Synthesizers", ADF4110-ADF4111-ADF4112-ADF4113, Analog Devices, 2003, 24 pages.
Burggraaf, "Chip scale and flip chip: Attractive Solutions", Solid State Technology, Jul. 1998, 5 pages.
Filtronic publication, Filtronic Components Limited, Sub Systems Division, West Yorkshire, England, 1994—2 pages.
K&L Microwave Incorporated, A Dover Technologies Company, Salisbury, England, 1988—2 pages.
Krems, et al., "Avoiding Cross Talk And Feed Back Effects In Packaging Coplanar Millimeter-Wave Circuits", WE4B-3, IEEE MTT-S Digest, 1998, pp. 1091-1094.
Lieberman et al., "1974 IEEE International Solid State Circuits Conference", pp. 100-101, 235.
M.A.R.Gunston, Microwave Transmission-Line Impedance Data, London, 1972, p. 52.
Makimoto et al., "Compact Bandpass Filters Using Stepped Impedance Resonators," Proceedings of the IEEE, vol. 67, No. 1, Jan. 1979, pp. 16-19.
Matthaei, et al., "Microwave Filters, Imedance Matching Networks and Coupling Structures", Dedham, MA, pp. 355-380, Published in 1964.
Moore et al., "1980 Ultrasonic Symposium", pp. 838-841.
Muhonen et al., "Amplifier Linearization for the Local Multipoint Distribution System Application," IEEE Personal, Mobile, Indoor and Radio Communication Conference, Boston, MA, 6 pages, Sep. 1998.0.
Ohiso, et al., "Flip-Chip Bonded 0.85-μm Bottom-Emitting Vertical-Cavity Laser Array on an AlGaAs Substrate", IEEE Photonics Technology Letters, vol. 8, No. 9, Sep. 1996, pp. 1115-1117.
Okeans, et al., "Properties of a TEM Transmission Line Used in Microwave Integrated Circuit Applications", Transactions of the IEEE, MIT-15, May 1967, pp. 327-328.
Peter, "Solder Flip-Chip and CSP Assembly System", Chip Scale Review, Jul./Aug. 1999, pp. 58-62.
Reeder et al., IEEE Transactions on Microwave Theory and Techniques, No. 11, Nov. 1969, pp. 927-941.
Sagawa et al., "Geometrical Structures and Fundamental Characteristics of Microwave Stepped Impedance Resonators," IEEE Transactions on Microwave Theory and Techniques, vol. 45, No. 7, Jul. 1997, pp. 1078-1085.
Sakai et al. "A Novel Millimeter-Wave IC on Si Substrate Using Flip-Chip Bonding Technology", IEICE Trans. Electron, vol. E78-C., No. 8, Aug. 1995, pp. 971-978.
Sundelin et al., "1979 Ultrasonic Symposium, IEEE", pp. 161-164.
Wadsworth, et al., "Flip Chip GaAs MMICs for Microwave MCM-D Applications", Advancing Microelectronics, May/Jun. 1998, pp. 22-25.
Wolf et al. "Silicon Processing for the VLSI era, vol. 1: Process Technology," Lattice Press, 2000, pp. 846-851, 863-865.
Shin-Barnett, "Intense wideband terahertz amplification using phase shifted periodic electron-plasmon coupling", Applied Physics Letters 92, 2008, 091501-1 to 091501-3.
Srivastava, "THz Vacuum Microelectronic Devices", Journal of Physics: Conference Series 114 (2008) 012015, 10 pages.
Carlsten et al., "Technology Development for a mm-Wave Sheet-Beam Traveling-Wave Tube", IEEE Transactions on Plasma Science, vol. 33, No. 1, Feb. 2005, pp. 85-93.
Krawczyk et al., "Design of a 300 GHZ Broadband TWT Coupler and RF-Structure", Proceedings of LINAC 2004, Lubeck, Germany, pp. 794-796.
400 MSPS, 14-Bit, 1.8 V CMO, Direct Digital Synthesizer, AD 9954, Analog Devices, www.analog.com, (2007).
1 GSPS Direct Digital Synthesizer, AD9858, Analog Devices, www.analog.com, (2003).
PLL Frequency Synthesizer ADF4106, Analog Devices, www.analog.com, (2005).

* cited by examiner

NOISE CANCELING TECHNIQUE FOR FREQUENCY SYNTHESIZER

BACKGROUND

The present disclosure is directed generally to frequency synthesizers.

Frequency synthesizers are widely used in modern radio communication systems. Such devices typically make use of a single quartz-controlled (i.e., crystal) reference oscillator combined with a phase-locked loop (PLL) to provide a multitude of output frequencies traceable to the highly stable reference from the oscillator.

Some frequency synthesizers employ multiple loop fine step frequency synthesis using a mix and divide technique. Other, single loop frequency synthesizers, employ digital phase detectors and integer or fractional frequency dividers. Single loop frequency synthesizers may employ a direct digital synthesizer (DDS) in the loop technique together with an analog phase detector and an auxiliary digital phase frequency detector for acquisition. Other implementations include frequency synthesizers for point to point radio supporting high data rates using complex modulation formats using carriers in the millimeter wave frequency range. These frequency synthesizers are required to perform broadband tuning, low phase noise and high frequency stability.

Shortcomings of conventional frequency synthesizers include phase noise, especially in the microwave frequency band, and tuning bandwidth limitations due to down-converting.

FIG. 1 is block diagram of a conventional frequency synthesizer 100. The frequency synthesizer 100 employs a divide by eight frequency divider 102 and a down-converting mixer 104. The divide by eight frequency divider 102 and the down-converting mixer 104 converts a signal 106 from a voltage controlled oscillator 108 (VCO) to an intermediate frequency (IF) signal 110 centered on 250 MHz for phase comparison with a variable frequency reference signal 112 generated by a DDS 114 section of a frequency synthesizer integrated circuit 116 such as an AD9858 frequency synthesizer integrated circuit available from Analog Devices, Inc. An on-chip digital phase/frequency detector 118 is employed for acquisition and an auxiliary analog phase detector 120 is employed to improve phase noise performance.

The performance of the conventional frequency synthesizer 100, however, is limited as follows. First, the phase comparison is performed using the variable frequency reference signal 112 generated directly by the DDS 114 clocked at 1 GHz. The spurious free dynamic range (SFDR) of the DDS 114 is approximately −50 dBc when it is used to generate a signal at a large fraction of the clock frequency, approximately one quarter in this case. This gives rise to troublesome spurious output signals. In telecommunications dBc indicates the relative dB levels of noise or sideband peak power, compared to the carrier power.

Second, in addition to the IF signal 110, the down-converting mixer 104 produces IF signals at frequencies IF=$F_{SIG}$+$F_{LO}$ (the lower sideband at 250 MHz is used when $F_{out}$=10 GHz). The mixer 104 also produces unwanted IF outputs one of which is at a frequency given by: $F_{SPUR}$=3$F_{LO}$−2$F_{SIG}$.

A first unwanted IF signal at 250 MHz will be generated when the output 122 of the synthesizer 100 is at 11 GHz because:

$$3 \times 1000 - 2 \times \left(\frac{11000}{8}\right) = 250 \quad (1)$$

A second unwanted IF signal will be generated when $F_{LO}$−$F_{SIG}$=250 MHz. This will occur when the output 122 of the synthesizer 100 is at 6 GHz because:

$$1000 - \left(\frac{6000}{8}\right) = 250 \quad (2)$$

Accordingly, the frequency synthesizer 100 may be operated only over the frequency range of:

$$11 \text{ GHz} > F_{OUT} > 6 \text{ GHz} \quad (3)$$

Accordingly, there exists a need for a frequency synthesizer operable at high frequencies (such as microwave frequencies) with improved phase noise characteristics capable of being tuned over an extended bandwidth.

SUMMARY

In one embodiment, a frequency synthesizer comprises an input terminal and an output terminal, a loop filter, a digital phase detector, and an analog phase detector. The digital phase detector comprises a first input coupled to the input terminal, a second input coupled to the output terminal, and an output coupled to the loop filter. The digital phase detector is configured to operate at a first phase comparison frequency. The analog phase detector comprises a first input coupled to the input terminal, a second input coupled to the output terminal, and an output that is alternating current (AC) coupled to the loop filter. The analog phase detector is configured to operate at a second phase comparison frequency. The first phase comparison frequency is different from the second phase comparison frequency.

DESCRIPTION

Figure 1:
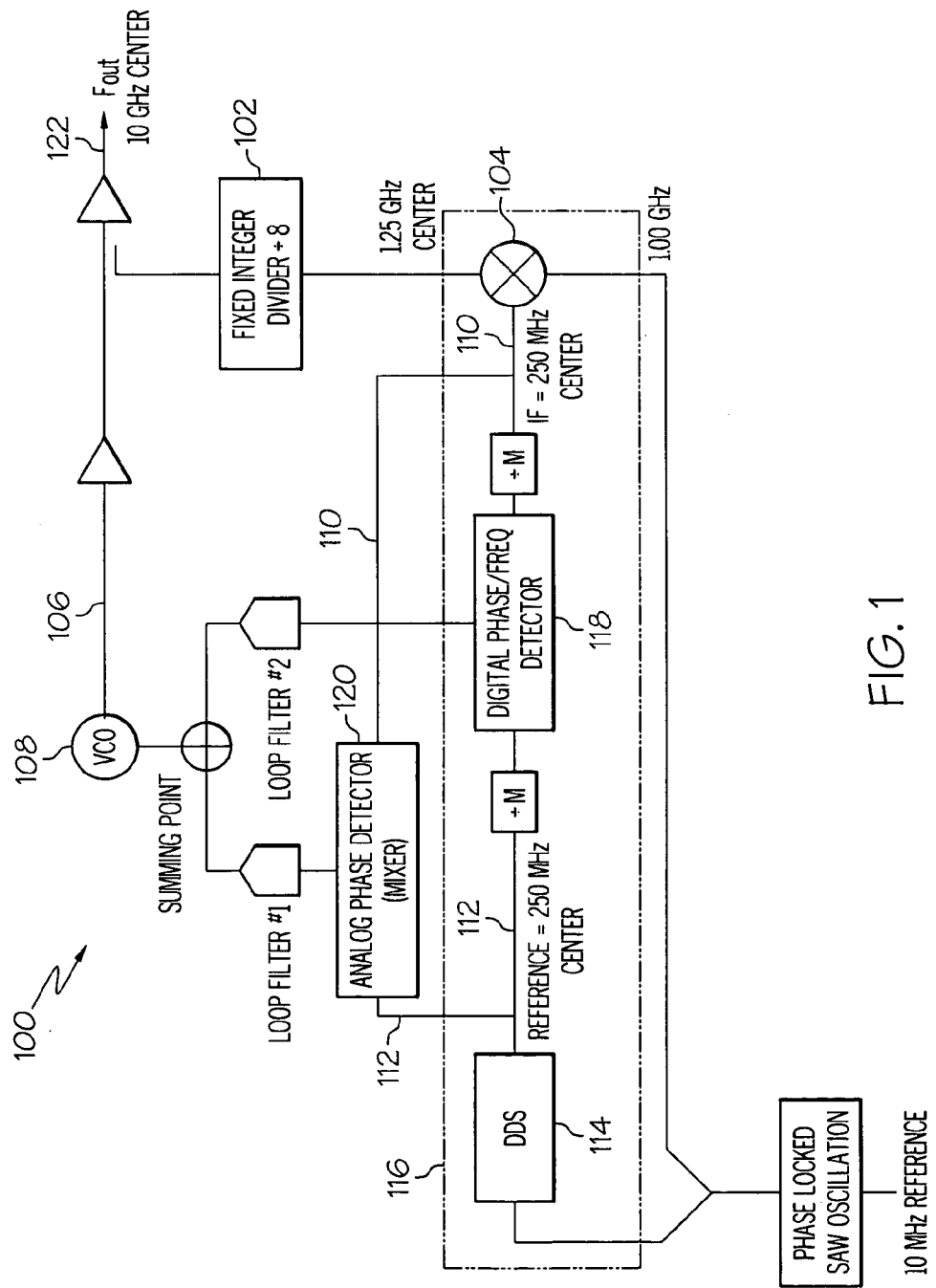
FIG. 1 is block diagram of a conventional frequency synthesizer.

In one general respect, the embodiments described herein are directed to a frequency synthesizer and more particularly to a system and method of reducing phase noise in microwave frequency synthesizers employing a compound phase locked loop comprising a digital phase/frequency detector and an analog phase detector. Analog phase detectors exhibit lower noise floors than digital devices. Analog phase detectors, however, are not able to sense frequency and therefore may be unable to acquire phase lock without the aid of some form of "aided acquisition" circuitry. In one embodiment, an analog phase detector and a digital phase detector may be configured to operate at different frequencies and the output of the analog phase detector is alternating current (AC) coupled into a loop filter. The digital phase/frequency detector may facilitate acquisition of phase lock and may set a suitable phase relationship for the signals applied to the analog phase detector.

According to various embodiments, the frequency synthesizer may comprise a DDS tracking PLL frequency synthesizer comprising a "compound PLL." In one embodiment, the tuning bandwidth of the frequency synthesizer may be limited only by the performance of its components. In one embodiment, the frequency synthesizer may be realized as a single integrated circuit.

In one embodiment, the frequency synthesizer may comprise a microwave frequency synthesizer comprising a compound PLL. The compound PLL may comprise a digital and an analog phase detector configured to operate at different phase comparison frequencies. The analog phase detector may be employed to detect residual phase noise due to the digital phase detector and frequency divider. The detected phase noise voltage may be AC coupled at a loop filter input node where it is destructively coupled (e.g., combined or summed) with residual noise voltage from the digital phase detector. The destructive coupling of the detected phase noise voltage and the residual noise voltage improve the overall phase noise characteristics of the frequency synthesizer to improve its overall performance. The embodiments are not limited in this context.

In one embodiment, the frequency synthesizer may comprise a digital phase/frequency detector with substantially identical frequency dividers. The substantially identical frequency dividers set the phase relationship of the signals at the inputs to the dividers to be in phase. This technique may facilitate the generation of phase quadrature signals to be fed to an analog phase detector. The embodiments are not limited in this context.

In one embodiment of the frequency synthesizer, the output signal of the digital phase/frequency detector and the output signal of the analog phase detector may be AC coupled such that the effects of voltage offset and direct current (DC) drift in the analog phase detector may be substantially or totally negated. As discussed above, this may be accomplished by destructively coupling these output signals at a node. In one embodiment, the node may comprise an input node of a loop filter. The embodiments are not limited in this context.

Figure 2:
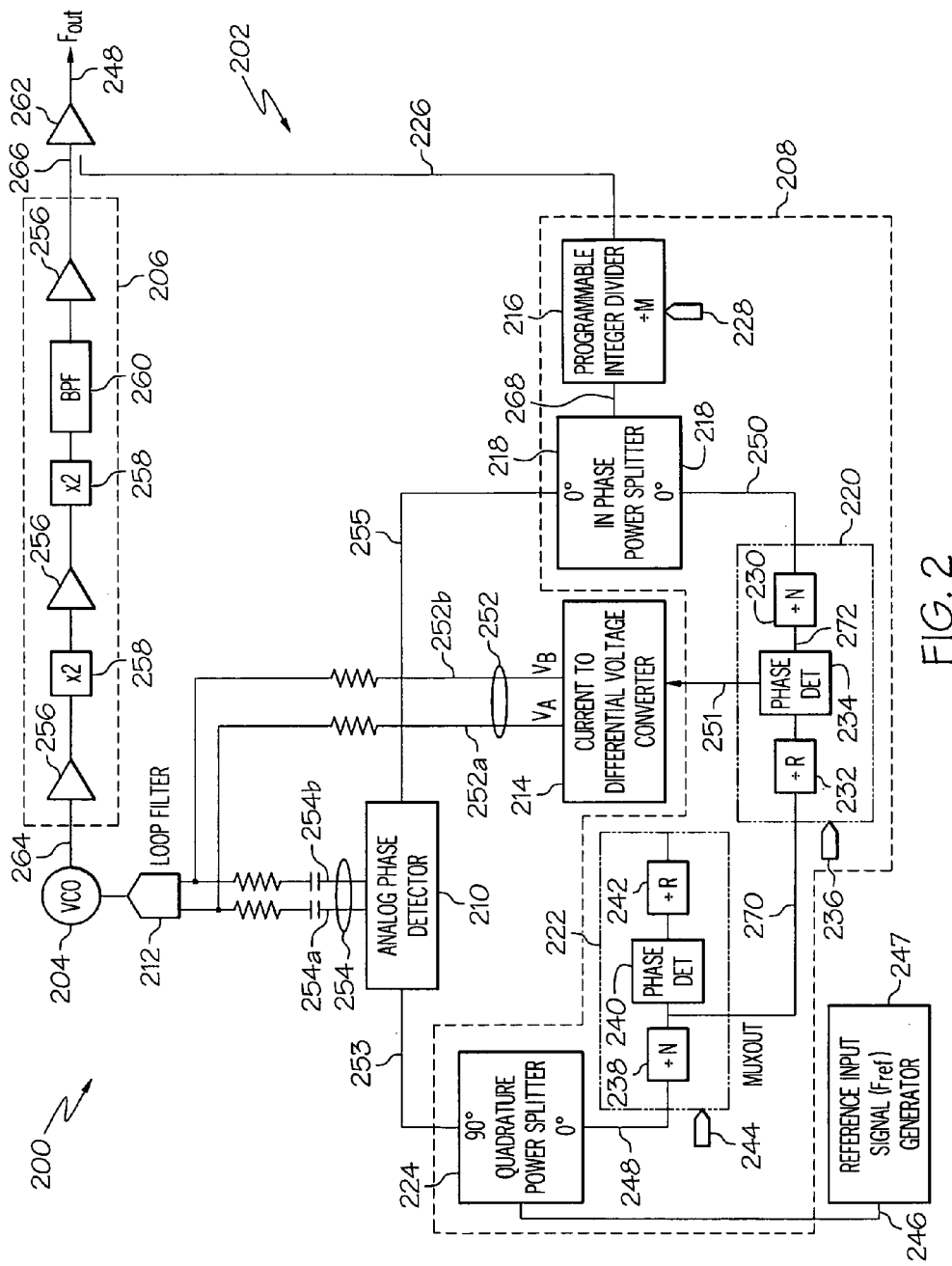
FIG. 2 is a block diagram of one embodiment of a frequency synthesizer.

FIG. 2 is a block diagram of one embodiment of a frequency synthesizer 200. As shown in FIG. 2, one embodiment of the frequency synthesizer 200 comprises a phase locked loop 202. The phase locked loop 202 comprises a voltage controlled oscillator (VCO) 204, a frequency multiplier chain 206, a programmable digital phase comparator module 208, an analog phase detector 210, a loop filter 212, and a current to differential voltage converter 214. The VCO 204 produces an output signal that is fed to the frequency multiplier chain 206. An output signal 248 ($F_{out}$) of the frequency synthesizer 200 is generated by the VCO 204 and the frequency multiplier chain 206. A sample of the output signal is fed back to the programmable digital phase comparator module 208. The current to differential voltage converter 214 converts the output signal of the programmable digital phase comparator module 208 to a differential signal that is fed to an input node at of the loop filter 212 where it is combined with the output signal of the analog phase detector 210 as described below. The embodiments, however, are not limited in the context in which they are described herein with reference to FIG. 2.

Accordingly, in one embodiment, the programmable digital phase comparator module 208 comprises a programmable integer divider 216, an in phase power splitter 218, a first PLL frequency synthesizer 220, a second PLL frequency synthesizer 222, and a quadrature power splitter 224. The programmable integer divider 216 receives a feedback signal 226, which is a sample of output signal 266 of the frequency multiplier chain 206. It will be appreciated by those skilled in the art that the frequency synthesizer output signal 248 may be a buffered, amplified, or attenuated version of the output signal 266. The programmable integer divider 216 may be programmed via programming inputs 228. In one embodiment, the programming inputs 228 may receive a digital signal comprising an n-bit parallel word, where n is any integer, for example. In one embodiment, the in phase power splitter 218 may comprise a resistor network. For example, the in phase power splitter 218 may comprise a three-resistor network.

In one embodiment, the first PLL frequency synthesizer 220 comprises an N divider 230, an R divider 232, and a first digital phase/frequency detector 234. The first PLL frequency synthesizer 220 may be programmed via programming input 236. The programming input 236 may be configured to receive a digital signal comprising an a-bit serial word, where a is any integer, for example. In the embodiment illustrated in FIG. 2, the R divider 232 is set to 1 and the N divider 230 is programmable via the programming input 236.

In one embodiment, the second PLL frequency synthesizer 222 comprises an N divider 238, an R divider 242, and a second digital phase/frequency detector 240. The second PLL frequency synthesizer 222 may be programmed via programming input 244. The programming input 244 may be configured to receive a digital signal comprising an a-bit serial word, where a is any integer, for example. In the embodiment illustrated in FIG. 2, the R divider 242 and the digital phase/frequency detector 240 are not used and the N divider 238 is programmable via the programming input 244.

In one embodiment the first and second PLL frequency synthesizers 220, 222 comprise substantially identical components. It may be preferable to employ PLL frequency synthesizers 220, 222 with substantially identical components to improve the overall phase noise performance of the frequency synthesizer 200. For example, the first and second digital phase/frequency detectors 234, 240 each may be formed as portions of a separate ADF4106 PLL frequency synthesizer integrated circuit available from Analog Devices, Inc.

In one embodiment, the microwave frequency output signal 248 ($F_{out}$) is generated by the VCO 204 and the frequency multiplier chain 206. For example, for an output signal 248 at 10 GHz, the VCO 204 may generate a 2.5 GHz signal 264 to drive a ×4 frequency multiplier chain 206 where the VCO output signal 264 is multiplied by a factor of four to produce the output signal 266. In the embodiment illustrated in FIG. 2, the frequency multiplier chain 206 comprises multiple buffers 256, two ×2 multipliers 258, and a band pass filter 260 operatively coupled to multiply and buffer the VCO 204 output signal 264 to generate the output signal 266 at a frequency of 10 GHz. The output signal 266 may be buffered by output buffer 262 to generate the frequency output signal 248 ($F_{out}$) at an output port or terminal of the frequency synthesizer 200, for example.

In one embodiment, a sample of the output signal 266 is fed to a high frequency programmable integer divider 216 circuit. One example of a suitable high frequency programmable integer divider 216 is a UXN14M9P available from Centellax. The division ratio of the high frequency programmable integer divider 216 device may be set to a number M such that the frequency of the output signal 268 of the programmable integer divider 216 is within a suitable range for downstream components or elements. As previously discussed, the high frequency programmable integer divider 216 device may be programmed via programming inputs 228 to any integer number M. In microwave frequency implementations, for example, the frequency of the output signal 268 may be in the ultra-high frequency (UHF) range. A reference input signal 246 ($F_{ref}$) of a suitable frequency may be generated by a reference input signal generator 247. For example, when the output signal 248 of the frequency synthesizer 200 has an output frequency of $F_{out}$=10 GHz, and the frequency of the output signal 268 of the programmable integer divider 216 is set to approximately 555.55555556 MHz to drive downstream components, then the programmable integer divider 216 is set to M=18.

In one embodiment, the output signal 268 of the programmable integer divider 216 is split into two paths by the in-phase power splitter 218. The first path feeds a first output signal 250 to the first PLL frequency synthesizer 220. As previously discussed, the first frequency synthesizer 220 may be an ADF4106 PLL frequency synthesizer integrated circuit available from Analog Devices. The division ratio of the N divider 230 of the first frequency divider 220 may be set via programming input 236 to set the frequency ($F_{comp}$) of the first input signal 250 within a suitable operating range of the first phase/frequency detector 234. For example, for the first phase/frequency detector 234 of an ADF4106 PLL frequency synthesizer circuit the first input signal frequency 250 may be scaled to $F_{comp}$=9.92063492 MHz with M=18 and N=56 and the division ratio of the R divider 232 is set to R=1.

In one embodiment, a second input signal 270 may be fed to the first phase/frequency detector 234 of the first PLL frequency synthesizer 220 via the R divider 232, which is set to R=1 in the embodiment illustrated in FIG. 2. The second input signal 270 may be derived from the second PLL frequency synthesizer 222 with the N divider 238 set to N=56. The N divider 238 of the second PLL frequency synthesizer 222 may be programmed via programming input 244. This N divider 238 also produces the second output signal 270 with a frequency of $F_{comp}$=9.92063492 MHz, in this example.

In one embodiment, a phase difference signal current 251 is generated by the first digital phase/frequency detector 234 of the first PLL frequency synthesizer 220. The phase difference signal current 251 may be fed to a current to differential voltage converter 214 circuit. The current to differential voltage converter 214 circuit produces a differential phase difference voltage signal 252 ($V_A$-$V_B$) between output terminals 252a and 252b. The differential phase difference voltage signal 252 ($V_A$-$V_B$) is fed to the differential input node of a differential input loop filter 212. The differential input loop filter 212 may comprise an, active, low-pass filter, for example.

In one embodiment, the PLL 202 acquires phase lock when power is applied to frequency synthesizer 200 when the signal 270 at the output port of the N divider 238 is in phase with the signal 272 at the output of the N divider 230. The output signals 270, 272 are generally in phase relative to each other because the phase/frequency detector 234 automatically locks to this condition. The signals 250 and 248 at the inputs of the respective first N divider 230 and the second N divider 238 also are in phase because the dividers are substantially identical, especially if they are formed as a single integrated circuit or as separate integrated circuit using the same semiconductor process.

In one embodiment, a second output signal 255 is fed from the in-phase power splitter 218 to an input of the analog phase detector 210. A second input signal 253 is fed to a second input of the analog phase detector 210. The second input signal 253 is a fundamental frequency signal, with no frequency division, derived from the reference input signal 246. In the embodiment illustrated in FIG. 2, the frequency of the second input signal 253 to the analog phase detector 210 is 555.55555556 MHz. The second input signal 253 may be derived from the quadrature power splitter 224 and is in quadrature with the reference input signal 246. The analog phase detector 210 may comprise a Gilbert cell circuit. One example of a Gilbert cell includes a HFA3101 Gilbert cell transistor array available from Intersil.

In one embodiment, the two input signals 253, 255 to the analog phase detector 210 are in phase quadrature relative to each other when the PLL 202 is held in lock by the first digital phase/frequency detector 234. The mean differential DC output voltage signal of the analog phase detector 210 may be substantially zero in this condition. The analog phase detector 210, however, produces a differential alternating output noise voltage 254 between terminals 254a and 254b corresponding to the residual phase noise of the digital phase/frequency detector 234 and the respective first and second N dividers 230, 238. The differential alternating output noise voltage 254 signal is AC coupled into the differential input node of the active low-pass loop filter 212 in any suitable manner such that it is destructively combined or summed with the residual noise voltage 252 from the current to differential voltage converter 214. As previously discussed, the residual noise voltage 252 is proportional to the noise current of the digital phase/frequency detector 234. The destructive coupling of the differential alternating output noise voltage 254 and the residual noise voltage 252 substantially reduces the amplitude of the noise sidebands of the output signal 248 ($F_{out}$). For example, when the analog phase detector 210 is operated directly at the reference input signal 246 frequency in the UHF frequency band, the noise floor will be degraded by a factor equal to 20 log N less than that of the digital phase/frequency detector 234, which is 20 log 56=35 dB, in this example.

Figure 3:
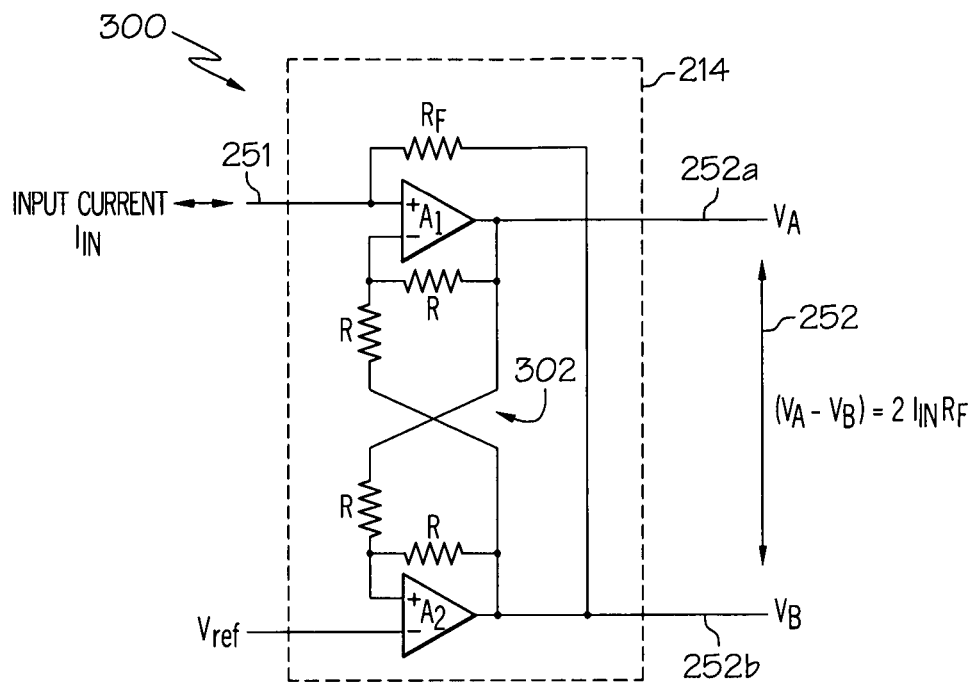
FIG. 3 is a schematic diagram of one embodiment of a current to differential voltage converter.

FIG. 3 is a schematic diagram of one embodiment of a current to differential voltage converter 300. In one embodiment, the current to differential voltage converter 300 is similar to the current to differential voltage converter 214 employed in the frequency synthesizer 200 illustrated in FIG. 2. Accordingly, in the embodiment illustrated in FIG. 3, the current to differential voltage converter 214 comprises first and second amplifiers $A_1$, $A_2$, a resistor network 302 comprising resistors R, and a feedback resistor $R_F$. The input current signal 251 ($I_{IN}$) from the digital phase/frequency detector 234 is applied through the feedback resistor $R_F$ to the output of the second amplifier $A_2$. A reference voltage signal $V_{ref}$ is applied to a positive input terminal of the second amplifier $A_2$. The resistor network 302 may be operatively coupled to the first and second amplifiers $A_1$, $A_2$ to generate a differential output voltage 252 between terminals 252a and 252b. In the illustrated embodiment, the differential output voltage 252 may be expressed formulaically as:

$$(V_A-V_B)=2*I_{IN}*R_F \quad (4)$$

The embodiments, however, are not limited in the context in which they are described herein with reference to FIG. 3.

Figure 4:
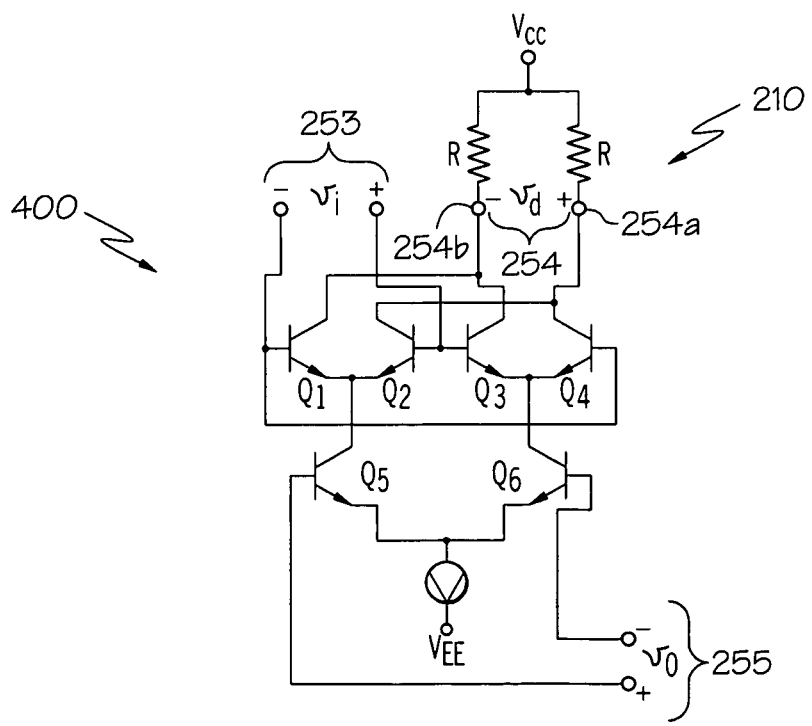
FIG. 4 is a schematic diagram of one embodiment of an analog phase detector comprising a Gilbert cell multiplier circuit.

FIG. 4 is a schematic diagram of one embodiment of an analog phase detector 400 comprising a Gilbert cell multiplier circuit. In one embodiment, the Gilbert cell multiplier circuit analog phase detector 400 is similar to the analog phase detector 210 employed in the frequency synthesizer 200 illustrated in FIG. 2. Accordingly, in the embodiment illustrated in FIG. 4, the analog phase detector 210 comprises transistors Q1-Q6 arranged to form a Gilbert multiplier cell connected between $V_{CC}$ and $V_{EE}$. The inputs to the analog phase detector 214 are denoted as $v_i$ and $v_o$ and the output of the analog phase detector 210 is denoted as $v_d$. For example, the first input signal 255 to the analog phase detector 210 may be denoted as $v_o$ and the second input signal 253 to the analog phase detector 210 may be denoted as $v_i$, for example. The output of the analog phase detector 210 may be denoted as first input signal 255 fed to the analog phase detector 210 as $v_d$, for example. The embodiments, however, are not limited in the context in which they are described herein with reference to FIG. 4.

Figure 5:
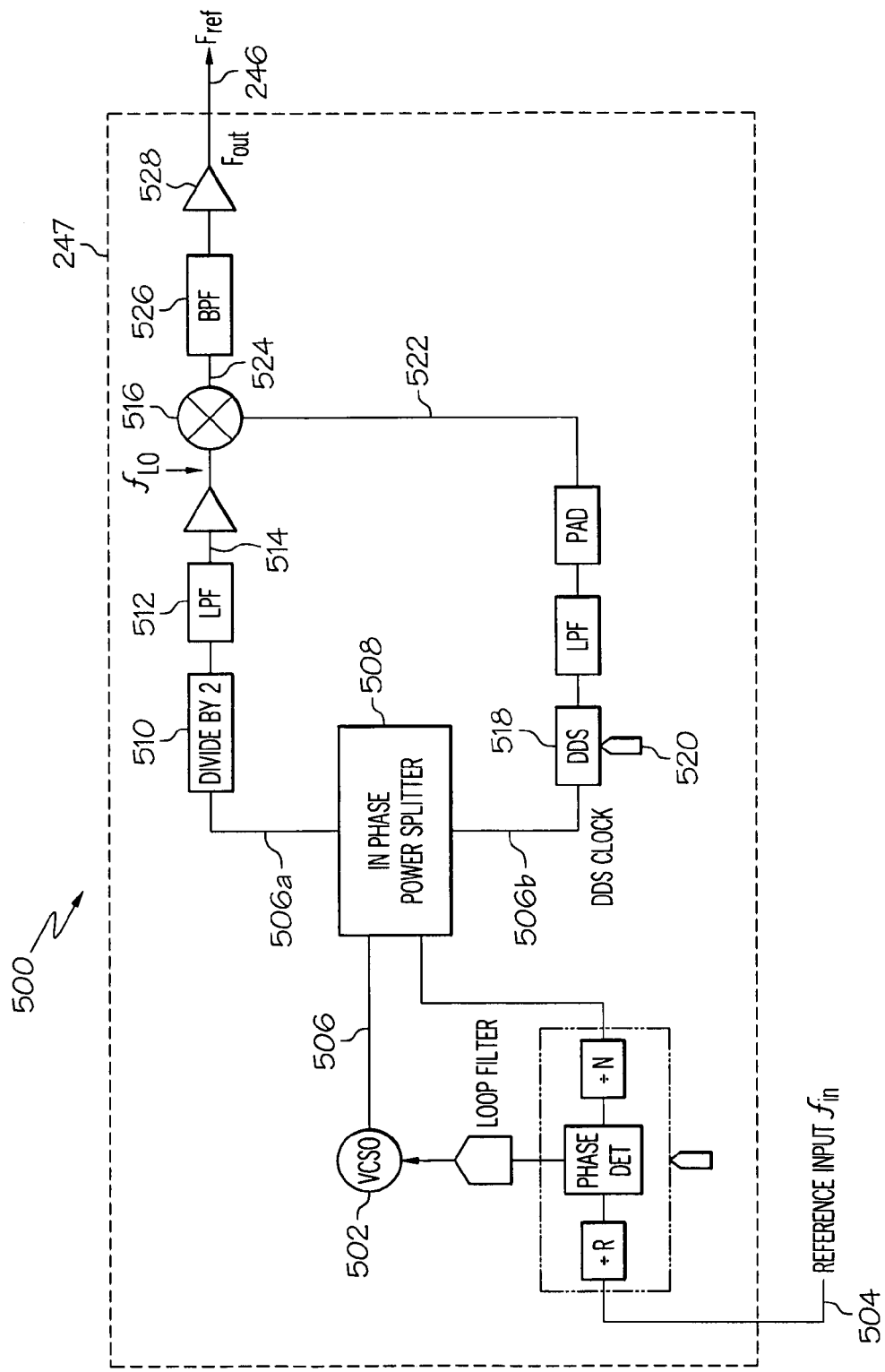
FIG. 5 is a block diagram of one embodiment of a reference input signal frequency generator.

FIG. 5 is a block diagram of one embodiment of a reference input signal frequency generator 500. In the embodiment illustrated in FIG. 5, the reference input signal frequency generator 500 is similar to the reference input signal frequency generator 247 employed in the frequency synthesizer 200 illustrated in FIG. 2. Accordingly, in the embodiment illustrated in FIG. 5, the reference input signal frequency generator 247 is a UHF reference signal generator. A voltage controlled, surface acoustic wave resonator oscillator 502 (VCSO) is phase locked to an input reference signal 504 at an input frequency $f_{in}$. For example, the input frequency $f_{in}$ of the incoming reference signal 504 may be $f_{in}$=10 MHz. The input reference signal 502 may be (usually) derived from an oven controlled crystal oscillator (OCXO), for example. The embodiments, however, are not limited in the context in which they are described herein with reference to FIG. 5.

The phase locked SAW VCSO oscillator 502 produces a very stable, low phase noise oscillator signal 506 which is fed to an in-phase power splitter 508. In one embodiment, the signal 506 has a frequency of 1000 MHz (or 1 GHz). A first half of the oscillator signal 506a is fed to a high speed divide by two circuit 510 and low-pass filter 512 to produce a sinusoidal voltage signal 514. In one embodiment, the sinusoidal voltage signal 512 is at a frequency of 500 MHz. The sinusoidal voltage signal 512 is amplified and used to provide a local oscillator drive $f_{LO}$ to an up-conversion mixer 516.

A second half of the oscillator signal 506b signal is used to clock a direct digital synthesizer 518 (DDS) device. In one embodiment, the DDS 518 may be an AD9912 available from Analog Devices. The DDS 518 may be programmed via programming inputs 520 to generate signals in a first frequency range, which are fed to the IF input 522 of the up-conversion mixer 516. In one embodiment, the first frequency range is 45 to 75 MHz. In one embodiment, the DDS 518 may comprise a 48-bit Accumulator section giving the device a frequency resolution (minimum step size) of:

$$F_{step} = \frac{F_{clock}}{2^{48}} \quad (5)$$

$$\therefore F_{step} = 3.55 \times 10^{-6} \text{ Hz} \quad (6)$$

The output signal 524 from the mixer 516 is filtered by band pass filter 526 and amplified by amplifier 528. The output signal 524 from the mixer 516 may be programmed to any frequency. In one embodiment, the output signal 524 from the mixer 516 may be programmed to any frequency between 545 and 575 MHz in steps of $3.55 \times 10^{-6}$ Hz, for example. In this example, the geometric center frequency ($F_{center}$) of the reference signal 246 ($F_{ref}$) of the reference generator 247 is approximately 560 MHz.

With reference now to FIGS. 2 and 5, in one embodiment, the microwave frequency synthesizer 200 may be programmed as follows:

The microwave PLL 202 divider ratio M of the programmable integer divider 216 may be set to the ratio of M=ROUND($F_{out}/F_{center}$).

For $F_{out}$=10.000 GHz, M=ROUND(10000/560)=18.

For $F_{out}$=10.000 GHz the frequency of the UHF reference input signal 246 ($F_{ref}$) is set to 10000/18=555.55555555555 MHz (to $1 \times 10^{-5}$ Hz accuracy).

The DDS 518 is programmed to generate a signal at a frequency of 55.5555555555 MHz.

In accordance with the embodiments illustrated in FIGS. 2-5, the frequency synthesizer 200 may be operated over a very wide tuning bandwidth, which may be limited only by the tuning range of the VCO 204, the minimum division ratio of the programmable integer divider 216 ($M_{min}$=8 for a UXN14M9P available from Centellax, for example), the maximum operating frequency of the programmable integer divider 216 (14 GHz for a UXN14M9P available from Centellax, for example), and the frequency range of the UHF reference generator 247. With M=8 and $F_{ref}$=545 MHz, $F_{out\,min}$=4360 MHz; and with M=25 and $F_{ref}$=560 MHz $F_{out\,max}$=14 GHz.

Figure 6:
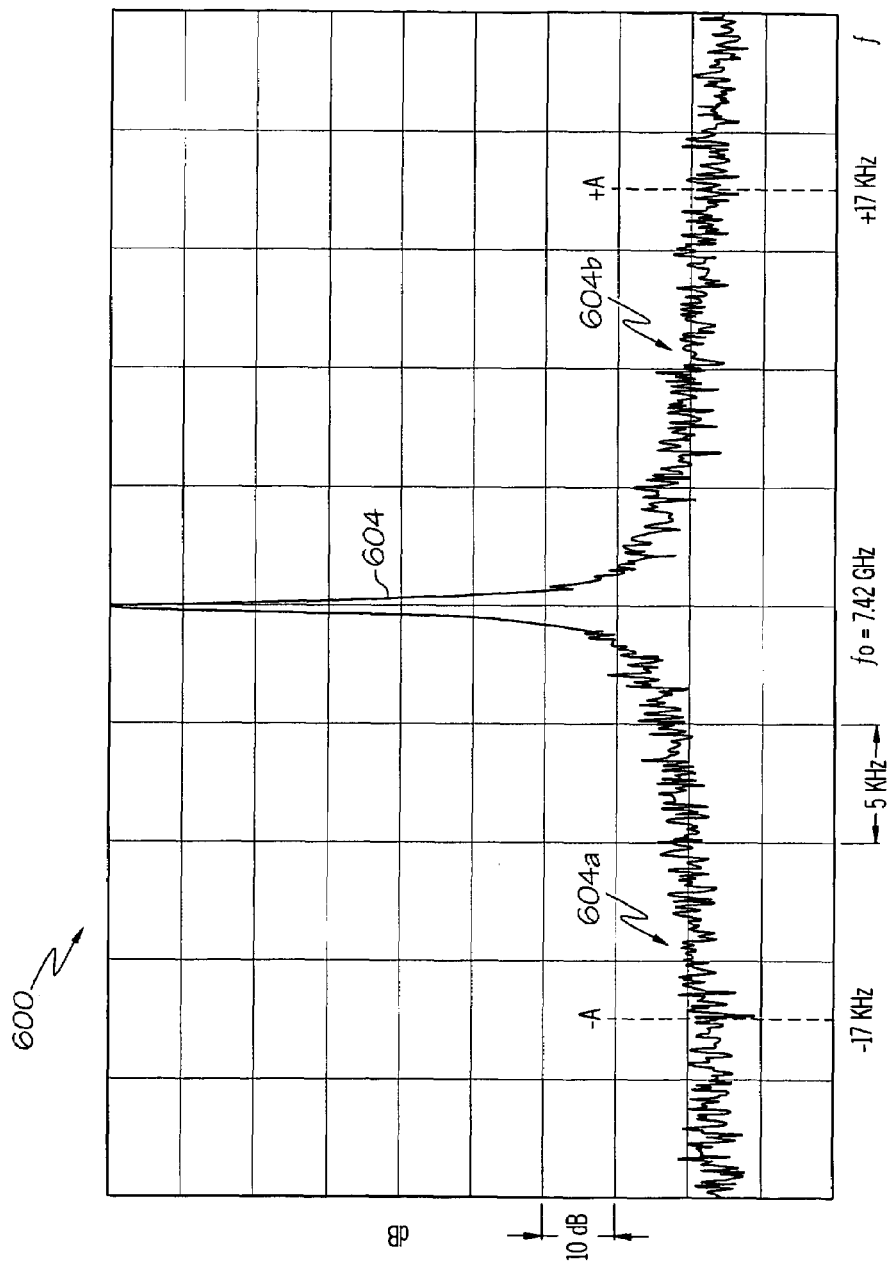
FIG. 6 is a spectral graph showing the phase noise performance of one embodiment of the frequency synthesizer shown in FIG. 2.
Figure 7:
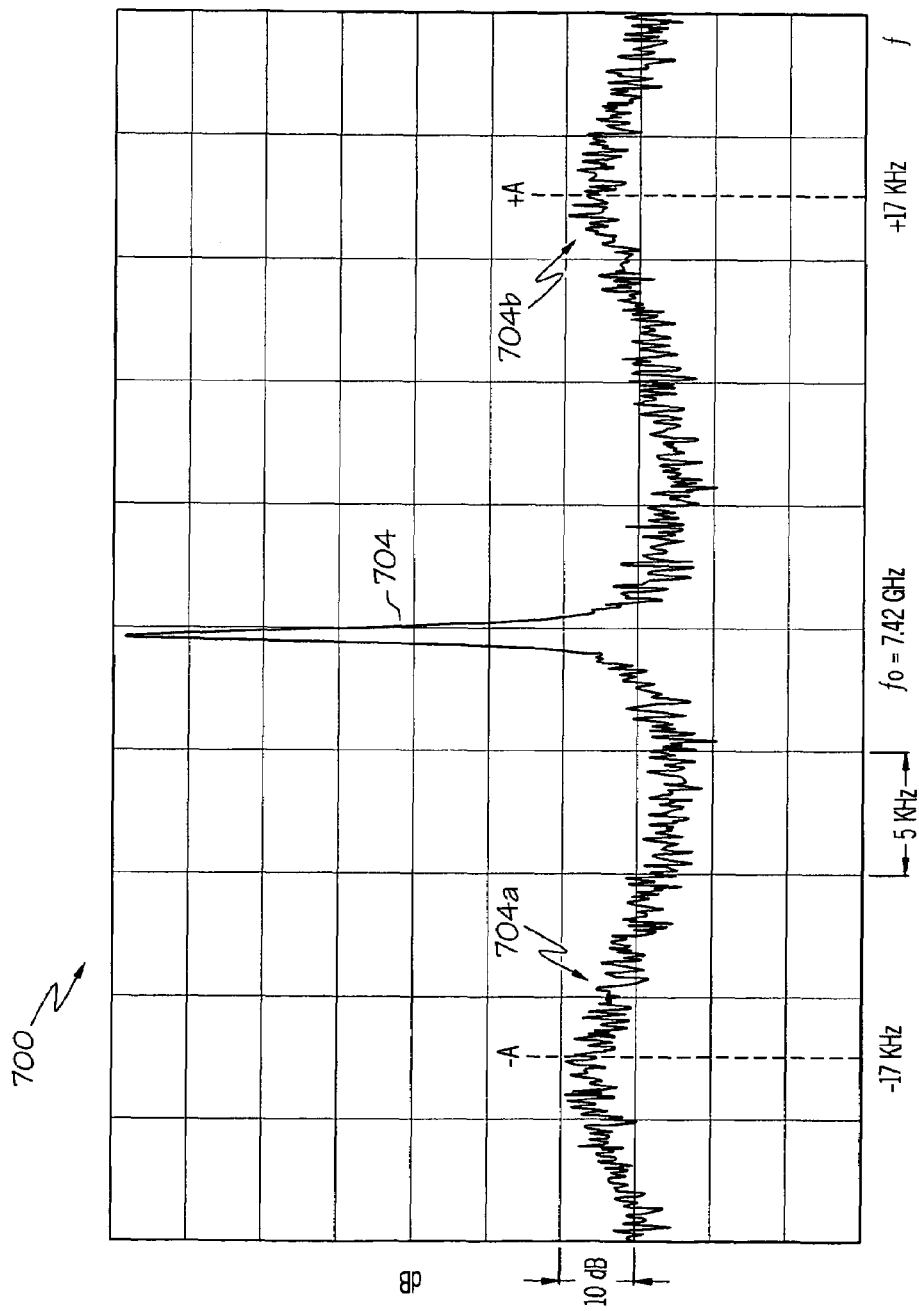
FIG. 7 is a spectral graph showing the phase noise performance of a conventional frequency synthesizer.

FIG. 6 is a spectral graph 600 showing the phase noise performance of one embodiment of the frequency synthesizer 200 shown in FIG. 2. FIG. 7 is a spectral graph 700 showing the phase noise performance of a conventional frequency synthesizer. The spectral graph 600 represents the ratio of power in the side bands 602a, b relative to the carrier power 604. The spectral graph 700 represents the ratio of power in the side bands 702a, b relative to the carrier power 704. The vertical scale for both spectral plots 600, 700 is 10 dB/div and the horizontal scale is 5 kHz/div. From FIG. 6 it can be seen that the carrier power 604, 704 is centered on 7.42 GHz. With respect to the sidebands, however, the spectral graph 600 of the frequency synthesizer 200 shows improved phase noise performance over the spectral graph 700 of the conventional frequency synthesizer. For example, with respect to the sidebands 604a,b and 704a,b at points ±A, which are ±17 kHz to either side of the carrier 604, 704, the spectral graph 600 of the frequency synthesizer 200 shows a 20 bB improvement in phase noise performance over the spectral graph 700 of the conventional frequency synthesizer.

Figure 8:
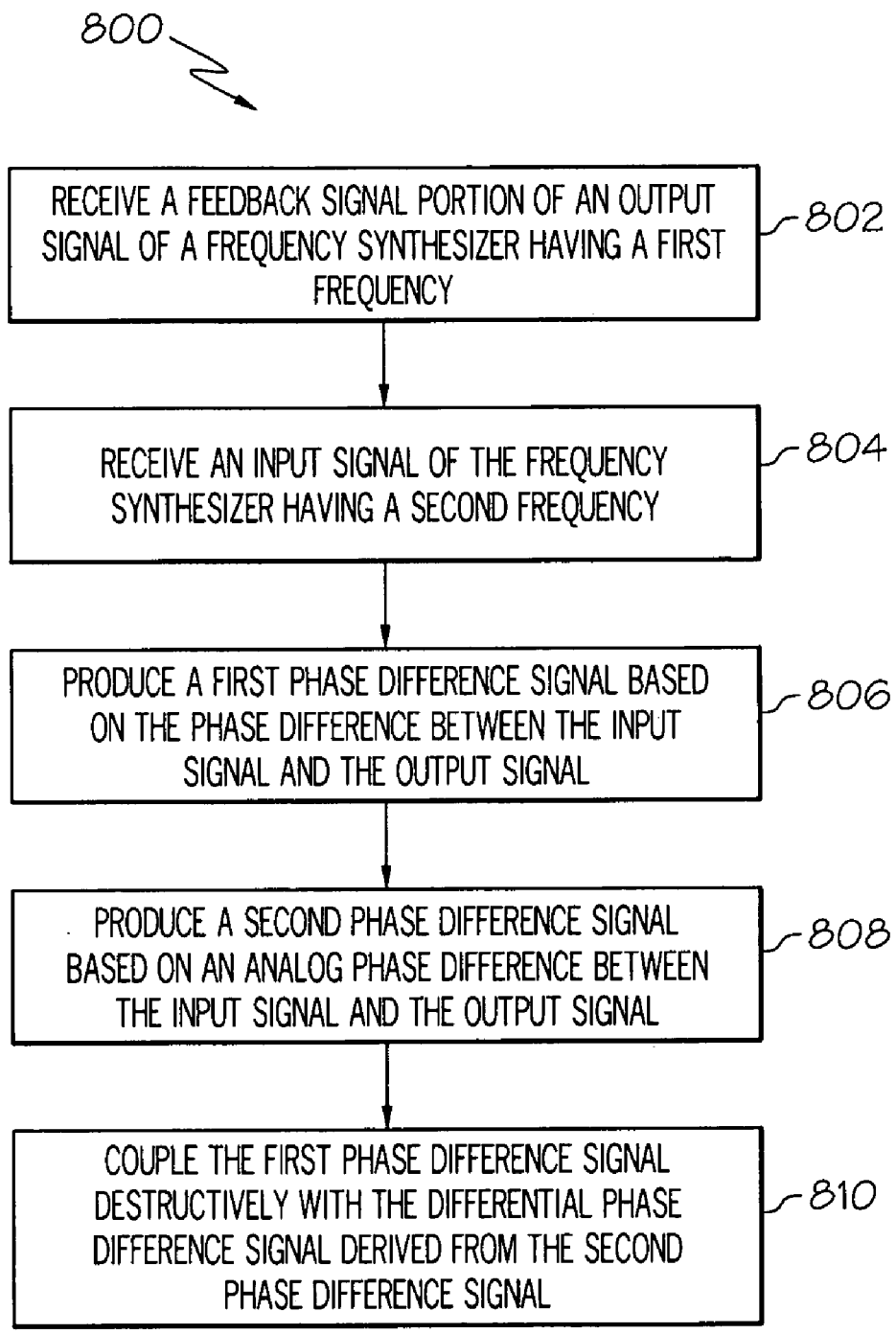
FIG. 8 is a flow diagram.

FIG. 8 is a flow diagram 800. The flow diagram 800 may be representative of the operations or functions executed by one or more elements or components of the frequency synthesizers described herein, such as the frequency synthesizer 200, for example. As shown in the flow diagram 800, the programmable digital phase comparator module 208 receives 802 the feedback signal 226 portion of the output signal 248 of the frequency synthesizer 200 having a first frequency. In one embodiment, the programmable digital phase comparator module 208 receives 804 an input signal 246 to the frequency synthesizer having a second frequency. The PLL frequency synthesizer 220 of the programmable digital phase comparator module 208 produces 806 a first phase difference signal 251 based on the phase difference between the input signal 246 and the output signal 248. In one embodiment, the current to differential voltage converter 214 generates a differential phase difference signal 252 from the first phase difference signal 251. The analog phase detector 210 produces 808 a second phase difference signal 254 based on an analog phase difference between the input signal 246 and the output signal 248. The differential phase difference signal 252 is applied to a differential input node of the loop filter 212. The differential phase difference signal 252 derived from the first phase difference signal 251 is DC coupled to the loop filter 212. The second phase difference signal 254 is AC coupled to the loop filter 212. The second phase difference signal 254 is destructively coupled 810 with the differential phase difference signal 252 derived from the first phase difference signal 251.

In one embodiment, the in phase splitter 218 splits the feedback signal 226 into a first signal 255 and a second signal 250, wherein the first and second signals 255, 250 are in in-phase relationship. The quadrature phase splitter 224 splits the input signal 246 into a third signal 253 and a fourth signal 248. The third and fourth signals 253, 248 are in quadrature-phase relationship. The PLL frequency synthesizer 220 produces the first phase difference signal 251 by detecting the difference between the fourth signal 248 and the second signal 250 and the first digital phase/frequency detector 234 locks at a relatively lower phase comparison frequency relative to the phase comparison frequency of the analog phase detector 210. The analog phase detector 210 produces the second phase difference signal 254 by detecting the phase difference between the third signal 253 and the first signal 255. The analog phase detector 210 reduces the phase noise because it operates at a much higher phase comparison frequency relative to the first digital phase/frequency detector 234.

In one embodiment, the programmable integer divider 216 divides the first frequency of the feedback signal 226 by a first integer. The second PLL frequency synthesizer 222 divides the second frequency of the input signal 246 by a second integer.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Some embodiments of the frequency synthesizer 200 and any processing module thereof may be implemented using an architecture that may vary in accordance with any number of factors, such as desired computational rate, power levels, heat tolerances, processing cycle budget, input data rates, output data rates, memory resources, data bus speeds and other performance constraints. For example, an embodiment may be implemented using software executed by a general-purpose or special-purpose processor. In another example, an embodiment may be implemented as dedicated hardware, such as a circuit, an application specific integrated circuit (ASIC), Programmable Logic Device (PLD) or digital signal processor (DSP), and so forth. In yet another example, an embodiment may be implemented by any combination of programmed general-purpose computer components and custom hardware components. The embodiments are not limited in this context.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

In various implementations, the frequency synthesizer 200 may be illustrated and described as comprising several separate functional elements, such as modules and/or blocks. Although certain modules and/or blocks may be described by way of example, it can be appreciated that a greater or lesser number of modules and/or blocks may be used and still fall within the scope of the embodiments. Further, although various embodiments may be described in terms of modules and/or blocks to facilitate description, such modules and/or blocks may be implemented by one or more hardware components (e.g., processors, DSPs, PLDs, ASICs, circuits, registers), software components (e.g., programs, subroutines, logic) and/or combination thereof.

The modules may comprise, or be implemented as, one or more systems, sub-systems, devices, components, circuits, logic, programs, or any combination thereof, as desired for a given set of design or performance constraints. For example, the modules may comprise electronic elements fabricated on a substrate. In various implementations, the electronic elements may be fabricated using silicon-based IC processes such as high-speed complementary metal oxide semiconductor (CMOS), bipolar, high-speed bipolar CMOS (BiCMOS) processes, for example, as well as Gallium Arsenide (GaAs), Indium Phosphide (InP), and/or Indium Arsenide heterojunction (InAs) bipolar transistors (HBT). The embodiments are not limited in this context Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the registers and/or memories of the computing system into other data similarly represented as physical quantities within the memories, registers or other such information storage, transmission or display devices of the computing system. The embodiments are not limited in this context.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

The invention claimed is:

1. A frequency synthesizer, comprising:
an input terminal and an output terminal;
a loop filter having a differential input;
a digital phase detector comprising a first input coupled to the input terminal, a second input coupled to the output terminal, and an output coupled to the differential input of the loop filter, wherein the digital phase detector is configured to operate at a first phase comparison frequency, and wherein the digital phase detector is configured to produce a first signal proportional to the phase difference between signals applied to the first and second inputs of the digital phase detector; and an analog phase detector comprising a first input coupled to the input terminal, a second input coupled to the output terminal, and a differential output alternating current (AC) coupled to the differential input of the loop filter, wherein the analog phase detector is configured to operate at a second phase comparison frequency, and wherein the analog phase detector is configured to produce a first differential signal corresponding to residual noise of the digital phase detector;

wherein the first phase comparison frequency is different from the second phase comparison frequency.

2. The frequency synthesizer of claim 1, comprising a first frequency divider coupled between the output terminal and the first input of the digital phase detector.

3. The frequency synthesizer of claim 2, wherein the first frequency divider is a programmable integer divider.

4. The frequency synthesizer of claim 1, comprising a first frequency divider coupled between the first input of the digital phase detector and the output terminal and a second frequency divider coupled between the second input of the digital frequency detector and the input terminal, wherein the first and second frequency dividers are substantially identical and set the phase relationship at the first and second inputs of the digital phase detector to be in phase.

5. The frequency synthesizer of claim 4, wherein the analog phase detector is configured to produce a first differential signal corresponding to residual noise of the digital phase detector and the first and second frequency dividers.

6. The frequency synthesizer of claim 1, comprising a current to differential voltage converter coupled to the output of the digital phase detector to receive the first signal proportional to the phase difference between the signals applied to the first and second inputs of the digital phase detector and to output a second differential signal proportional to noise of the digital phase detector, wherein the second differential signal is direct current (DC) coupled to the differential input of the loop filter.

7. The frequency synthesizer of claim 6, comprising:
wherein the first differential signal output of the analog phase detector is AC coupled to the second differential signal proportional to noise of the digital phase detector.

8. The frequency synthesizer of claim 1, comprising:
an in-phase power splitter comprising an input coupled to the output terminal and a first output coupled to the first input of the digital phase detector and second output coupled to the first input of the analog phase detector.

9. The frequency synthesizer of claim 8, comprising:
a quadrature phase power splitter comprising an input to receive a reference frequency signal coupled to the second input of the analog phase detector; and
an in-phase output coupled to the second input of the digital phase detector.

10. The frequency synthesizer of claim 1, comprising a voltage controlled oscillator (VCO) coupled between the loop filter and the output terminal.

11. The frequency synthesizer of claim 10, comprising a frequency multiplier coupled between the VCO and the output terminal.

12. A method, comprising:
receiving an output signal having a first frequency at a first input of an analog phase detector,
receiving an input signal at the first frequency at a second input of the analog phase detector;
receiving a first signal having a second frequency at a first input of a digital phase detector;

receiving a second signal at the second frequency at a second input of the digital phase detector, wherein the first frequency is different from the second frequency;

producing a first differential signal by the analog phase detector corresponding to a phase difference between the input signal and the output signal, wherein the first differential signal corresponds to noise of the digital phase detector;

producing a second differential signal corresponding to a phase difference between the first and second signals, wherein the second differential signal is proportional to noise of the digital phase detector; and destructively combining the first and second differential signals at a differential input of a loop filter.

13. The method of claim 12, comprising:
splitting the output signal into a third signal and a fourth signal, wherein the third and fourth signals are in in-phase relationship; and
splitting the input signal into a fifth signal and a sixth signal, wherein the fifth and sixth signals are in quadrature-phase relationship.

14. The method of claim 13, comprising:
receiving the third and the fifth signals at the respective first and second inputs of the analog phase detector, wherein the third and the fifth signals are in quadrature-phase relationship;
producing the first differential signal by detecting the difference between the third signal and the fifth signal;
receiving the fourth and the sixth signals at the respective first and second inputs of the digital phase detector, wherein the fourth and sixth signal are in in-phase relationship; and
producing the second differential signal by detecting the phase difference between the fourth signal and the sixth signal.

15. The method of claim 14, comprising:
direct current (DC) coupling the second differential signal to the differential input of the loop filter; and
alternating current (AC) coupling the first differential signal to the differential input of the loop filter.

16. The method of claim 12, comprising:
dividing the frequency of the output signal by a first integer by a first divider circuit to produce the first frequency;
receiving the first frequency signal at the first input of the analog phase detector;
dividing the first frequency by a second integer to produce the second frequency; and
receiving the second frequency signal at the first input of the digital phase detector.

17. The method of claim 16, comprising:
producing a first differential signal by the analog phase detector corresponding to a phase difference between the input signal and the output signal, wherein the first differential signal corresponds to noise of the digital phase detector and the first and second frequency dividers.

18. The method of claim 16, comprising:
phase shifting the input signal;
receiving the phase shifted input signal at the second input of the analog phase detector;
dividing the frequency of the input signal by the first integer by a third divider circuit to produce the second frequency; and
receiving the second frequency signal at the second input of the digital phase detector.

19. A compound phase locked loop, comprising:

a programmable frequency divider to receive a sample of an output signal having a first frequency and to divide the output signal frequency by a first integer to produce an output signal at a second frequency;

a quadrature power splitter to receive an input signal at the second frequency and to provide in-phase and quadrature output signals;

a loop filter having a differential input;

a digital phase detector comprising a first input coupled to an output of the programmable frequency divider, a second input coupled to the in-phase output of the quadrature power splitter, and an output coupled to the differential input of the loop filter, wherein the digital phase detector is configured to operate at a first phase comparison frequency, and wherein the digital phase detector is configured to produce a first signal proportional to the phase difference between signals applied to the first and second inputs of the digital phase detector; and an analog phase detector comprising a first input coupled to the output of the programmable frequency divider, a second input coupled to the quadrature output of the quadrature power splitter, and a differential output alternating current (AC) coupled to the differential input of the loop filter, wherein the analog phase detector is configured to operate at a second phase comparison frequency, and wherein the analog phase detector is configured to produce a first differential signal corresponding to residual noise of the digital phase detector;

wherein the first phase comparison frequency is different from the second phase comparison frequency.

20. The compound phase locked loop of claim 19, comprising:

an in-phase power splitter to split the output signal into a first and second signal, wherein the first and second signals are in in-phase relationship.

21. The compound phase locked loop of claim 19, comprising:

a first frequency divider coupled between the first input of the digital phase detector and the output of the programmable frequency divider to divide the first frequency of the sample of the output signal by a second integer; and a second frequency divider coupled between the second input of the digital phase detector and the output of the in-phase output of the quadrature power splitter to divide the second frequency of the input signal by the second integer.

22. The compound phase locked loop of claim 19, comprising:

a current to differential voltage converter coupled to the output of the digital phase detector to receive the first signal proportional to the phase difference between the signals applied to the first and second inputs of the digital phase detector and to output a second differential signal proportional to noise of the digital phase detector, wherein the second differential signal is direct current (DC) coupled to the differential input of the loop filter.

* * * * *